(12) United States Patent
Lai et al.

(10) Patent No.: US 7,492,021 B2
(45) Date of Patent: Feb. 17, 2009

(54) MAGNETIC TRANSISTOR

(75) Inventors: James Chyi Lai, Saint Paul, MN (US); Tom Allen Agan, Saint Paul, MN (US)

(73) Assignee: Northern Lights Semiconductor Corp., Saint Paul, MN (US)

( * ) Notice: Subject to any disclaimer, the term of this patent is extended or adjusted under 35 U.S.C. 154(b) by 0 days.

(21) Appl. No.: 11/549,726

(22) Filed: Oct. 16, 2006

(65) Prior Publication Data

US 2007/0164382 A1    Jul. 19, 2007

Related U.S. Application Data

(60) Provisional application No. 60/727,345, filed on Oct. 17, 2005.

(51) Int. Cl.
*H01L 29/82* (2006.01)

(52) U.S. Cl. .............................. 257/422; 257/E29.167

(58) Field of Classification Search ......... 257/421–427, 257/E29.323, E29.167
See application file for complete search history.

(56) References Cited

U.S. PATENT DOCUMENTS

| | | | | |
|---|---|---|---|---|
| 4,806,998 A | * | 2/1989 | Vinter et al. ................ | 257/192 |
| 5,962,905 A | * | 10/1999 | Kamiguchi et al. ......... | 257/421 |
| 6,218,718 B1 | * | 4/2001 | Gregg et al. ................ | 257/421 |
| 6,297,987 B1 | * | 10/2001 | Johnson et al. ............. | 365/158 |
| 6,753,562 B1 | * | 6/2004 | Hsu et al. ................... | 257/295 |
| 2006/0049474 A1 | * | 3/2006 | Nguyen Van Dau ......... | 257/423 |
| 2007/0109853 A1 | * | 5/2007 | Ho ........................ | 365/185.05 |

\* cited by examiner

*Primary Examiner*—Lynne A. Gurley
*Assistant Examiner*—Colleen Matthews
(74) *Attorney, Agent, or Firm*—Thomas, Kayden, Horstemeyer & Risley

(57) ABSTRACT

A magnetic transistor includes a magnetic section, a thin semiconductor layer, a first metal terminal, a second metal terminal, and a third metal terminal. The thin semiconductor layer is disposed on the magnetic section. The first metal terminal is disposed on one end of the magnetic section, acting as a gate of the magnetic transistor and capable of providing a conductive channel in the thin semiconductor layer. The second metal terminal and the third metal terminal are disposed respectively on one end and the other end of the thin semiconductor layer, capable of creating a conductive region. While the magnetic transistor is turned on, a current path is formed between the second metal terminal and the third metal terminal via the thin semiconductor layer.

7 Claims, 4 Drawing Sheets

MAGNETIC TRANSISTOR

CROSS-REFERENCE TO RELATED APPLICATION

This application claims the priority benefit of U.S. Provisional Application Ser. No. 60/727,345, filed Oct. 17, 2005, the full disclosures of which are incorporated herein by reference.

BACKGROUND

1. Field of Invention

The present invention relates to a transistor. More particularly, the present invention relates to a magnetic transistor.

2. Description of Related Art

The Giant Magnetoresistance Effect (GMR) is a quantum mechanical effect observed in structures with alternating thin magnetic and thin nonmagnetic sections. The GMR effect shows a significant change in electrical resistance from the zero-field high resistance state to the high-field low resistance state according to an applied external field.

FIG. 1 is a structure diagram depicting a conventional magnetic transistor 100 of the prior art. The conductive section 106 is disposed on the second magnetic section 104, and the first magnetic section 102 is disposed on the conductive section 106. The first metal 108 is adjacent to and completely covers one side of the first magnetic section 102, the conductive section 106, and the second magnetic section 104. The second metal 110 is adjacent to and completely covers the other side of the first magnetic section 102, the conductive section 106, and the second magnetic section 104.

Operation of the conventional magnetic transistor 100 is explained as follows. The operation of the magnetic transistor 100 is according to a first current flows in the third metal 112 and a second current flows in the fourth metal 114 to respectively control the dipole direction of the first magnetic section 102 and the second magnetic section 104. When the conventional magnetic transistor 100 is turned on, a current is generated and flows in the direction of the first metal and the second metal. When the dipole direction of the first magnetic section 102 and the second magnetic section 104 are both from left to right, the current flows from the first metal 108 to the second metal 110. When the dipole direction of the first magnetic section 102 and the second magnetic section 104 are both from right to left, the current flows from the second metal 110 to the first metal 108. When the dipole direction of the first magnetic section 102 and the second magnetic section 104 are different, no current flow between the first metal 108 and the second metal 110.

For the foregoing reason, there is a need to have a magnetic transistor that can be operated based on one dipole.

SUMMARY

According to one embodiment of the present invention, A magnetic transistor includes a magnetic section, a thin semiconductor layer, a first metal terminal, a second metal terminal, and a third metal terminal. The thin semiconductor layer is disposed on the magnetic section. The first metal terminal is disposed on one end of the magnetic section, acting as a gate of the magnetic transistor and is capable of providing a conductive channel in the thin semiconductor layer. A thickness of the conductive channel is increased while the magnetic transistor is turned on. The second metal terminal is disposed on one end of an opposite surface to the magnetic section of the thin semiconductor layer. The second metal terminal is capable of creating a first conductive region in the thin semiconductor layer. The third metal terminal is disposed on the other end of the opposite surface to the magnetic section of the thin semiconductor layer. The third metal terminal is capable of creating a second conductive region in the thin semiconductor layer. While the magnetic transistor is turned on, the first conductive region, the second conductive region, and the conductive channel are met and a current path is formed between the second metal terminal and the third metal terminal via the thin semiconductor layer.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
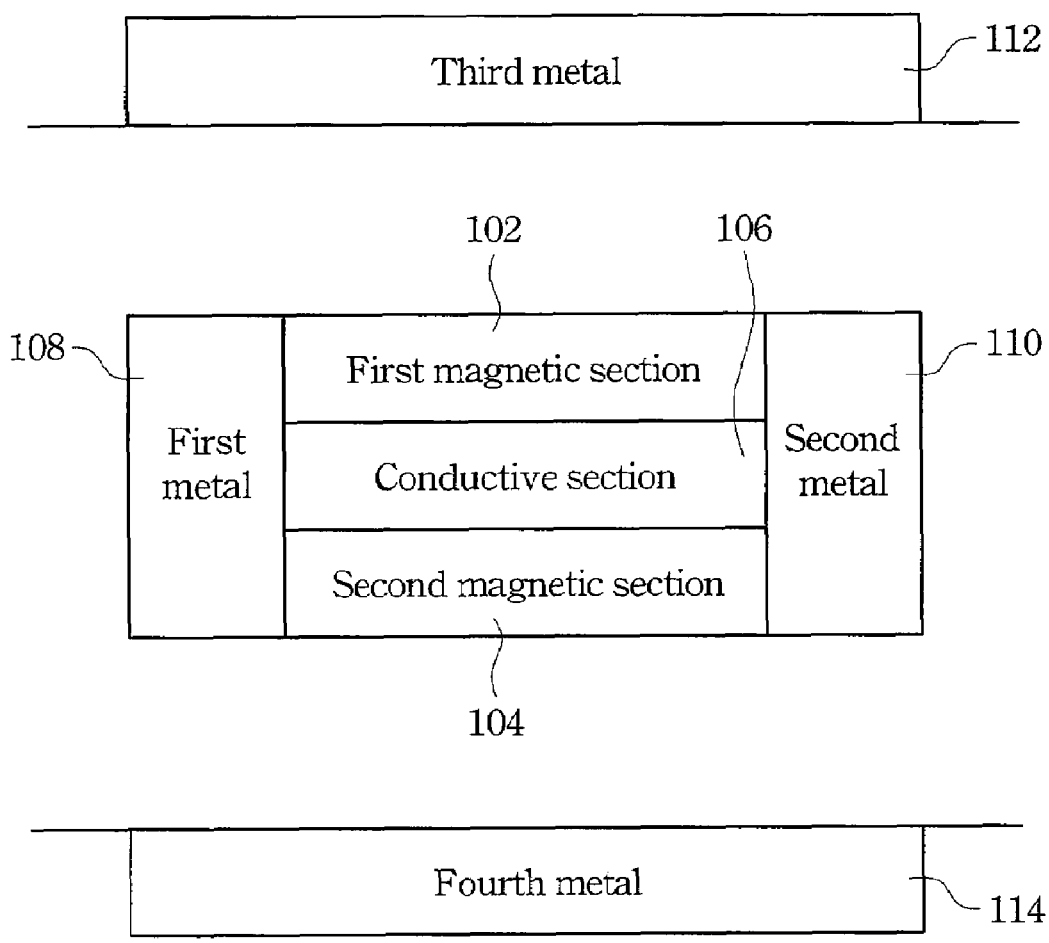
FIG. 1 is a structure diagram depicting a magnetic transistor of the prior art.

Reference will now be made in detail to the present preferred embodiments of the invention, examples of which are illustrated in the accompanying drawings. Wherever possible, the same reference numbers are used in the drawings and the description to refer to the same or like parts.

All figures are drawn for ease of explanation of the basic teachings of the present invention only; the extensions of the figures with respect to number, position, relationship, and dimensions of the parts to form the embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

Figure 2A:
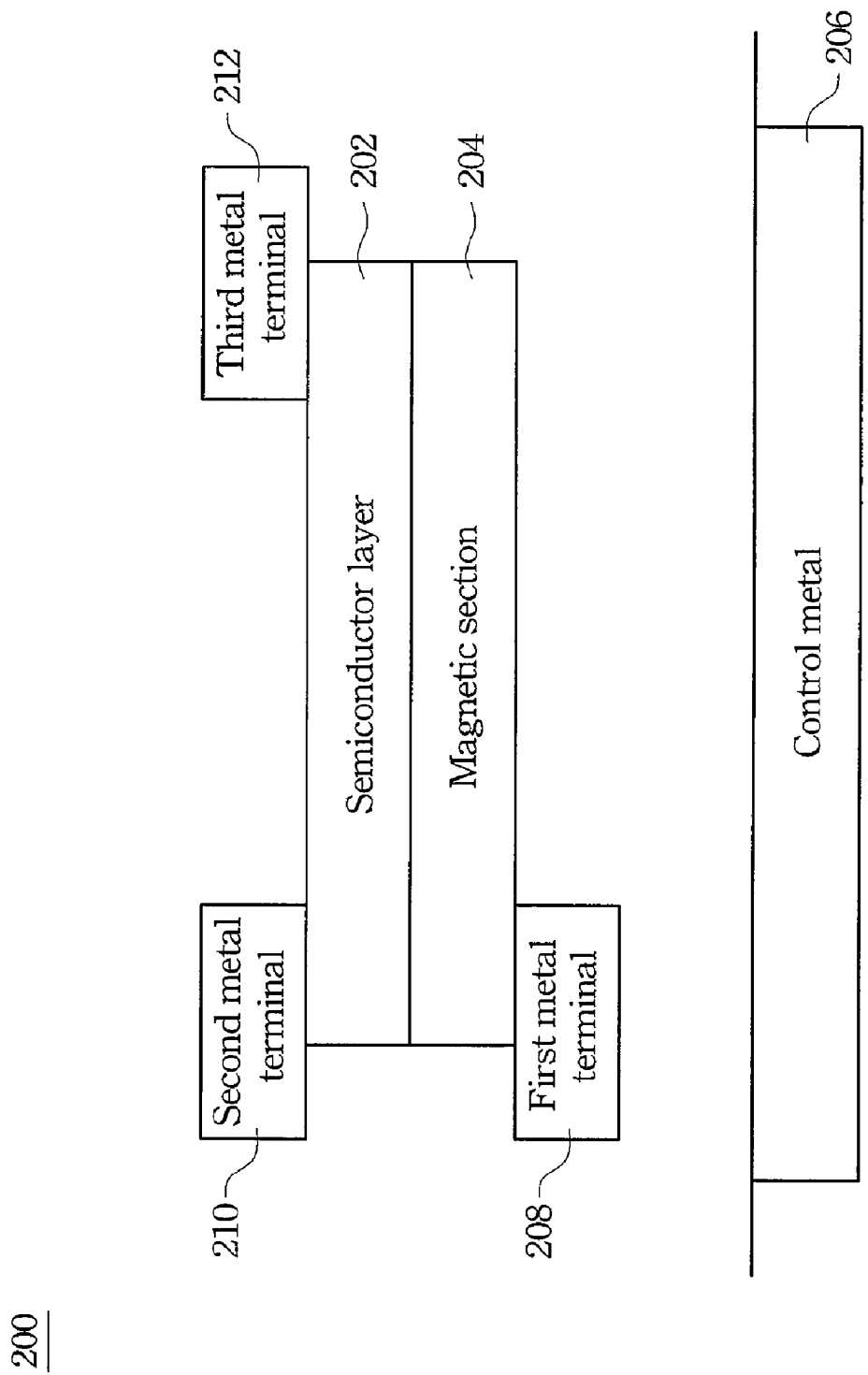
FIG. 2A is a structure diagram depicting a magnetic transistor according to one embodiment of this invention.

FIG. 2A is a structure diagram depicting a magnetic transistor 200 according to one embodiment of this invention. A magnetic transistor 200 includes a thin semiconductor layer 202, a magnetic section 204, a first metal terminal 208, a second metal terminal 210, and a third metal terminal 212. Those skilled in the art will recognize the magnetic section 204, for example, are made up from a multiple magnetic layers, and the thin semiconductor layer 202 is made up from the semiconductor material, for example, silicon.

The thin semiconductor layer 202 is disposed on the magnetic section 204. The magnetic section 204 and the thin semiconductor layer 202 are about the same length.

The first metal terminal 208 is disposed on one end of an opposite surface to the thin semiconductor layer 202 of the magnetic section 204. The second metal terminal 210 is disposed on one end of an opposite surface to the magnetic section 204 of the thin semiconductor layer 202. The third metal terminal 212 is disposed on the other end of the opposite surface to the magnetic section 204 of the thin semiconductor layer 202. For example, the first metal terminal 208 is disposed partially on one end of an opposite surface to the thin semiconductor layer 202 of the magnetic section 204. The second metal terminal 210 is disposed partially on one end of an opposite surface to the magnetic section 204 of the thin semiconductor layer 202. The third metal terminal 212 is disposed partially on the other end of the opposite surface to the magnetic section 204 of the thin semiconductor layer 202.

In addition, a space exists between the second metal terminal 210 and the third metal terminal 212 disposed on the thin semiconductor layer 202. The first metal terminal 208 acting as a gate, the second metal terminal 210 and the third metal terminal 212 acting as a source and a drain respectively for the magnetic transistor 200. The first metal terminal 208 is capable of providing a conductive channel 290 in the thin semiconductor layer 202. A thickness of the conductive channel 290 is increased while the magnetic transistor 200 is turned on. The second metal terminal 210 is capable of creating a first conductive region 270 in the thin semiconductor layer 202. The third metal terminal 212 is capable of creating a second conductive region 280 in the thin semiconductor layer 202. A current path is formed when the first conductive region 270 and the second conductive region 280 are met with the conductive channel 290 in the thin semiconductor layer 202.

The operation of the magnetic transistor 200 is determined by the dipole of the magnetic section 204 or a thickness of the thin semiconductor layer 202. A threshold voltage decides the minimum voltage to operate the magnetic transistor 200. Therefore, the thickness of the semiconductor layer 202 can be designed based on the threshold voltage of the magnetic transistor 200.

Those skilled in the art will be aware that the operation of the magnetic transistor 200, for example, is also according to an external applied field. For example, using a current flow in the control metal 206 to control the dipole direction of the magnetic section 204.

Figure 2B:
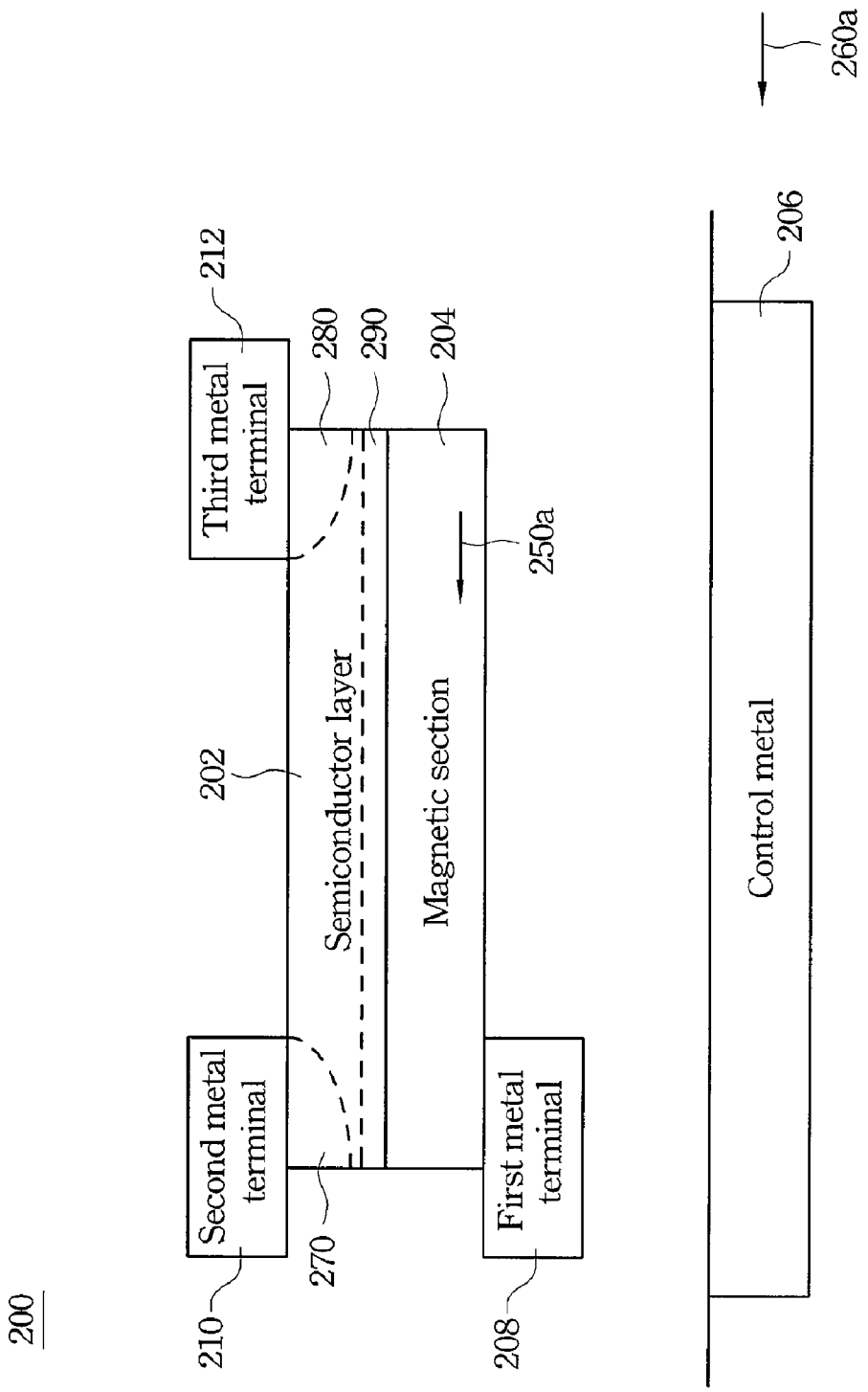
FIG. 2B and FIG. 2C are the operation of a magnetic transistor according to one embodiment of this invention.

FIG. 2B illustrates there is no current path in the magnetic transistor 200. A current (for example, direction 260a) in the control metal 206 provides a dipole having a direction 250a in the magnetic section 204. The first conductive region 270, the second conductive region 280 and the conductive channel 290 does not met which results in no current path being formed between the second metal terminal 210 and the third metal terminal 212.

Figure 2C:
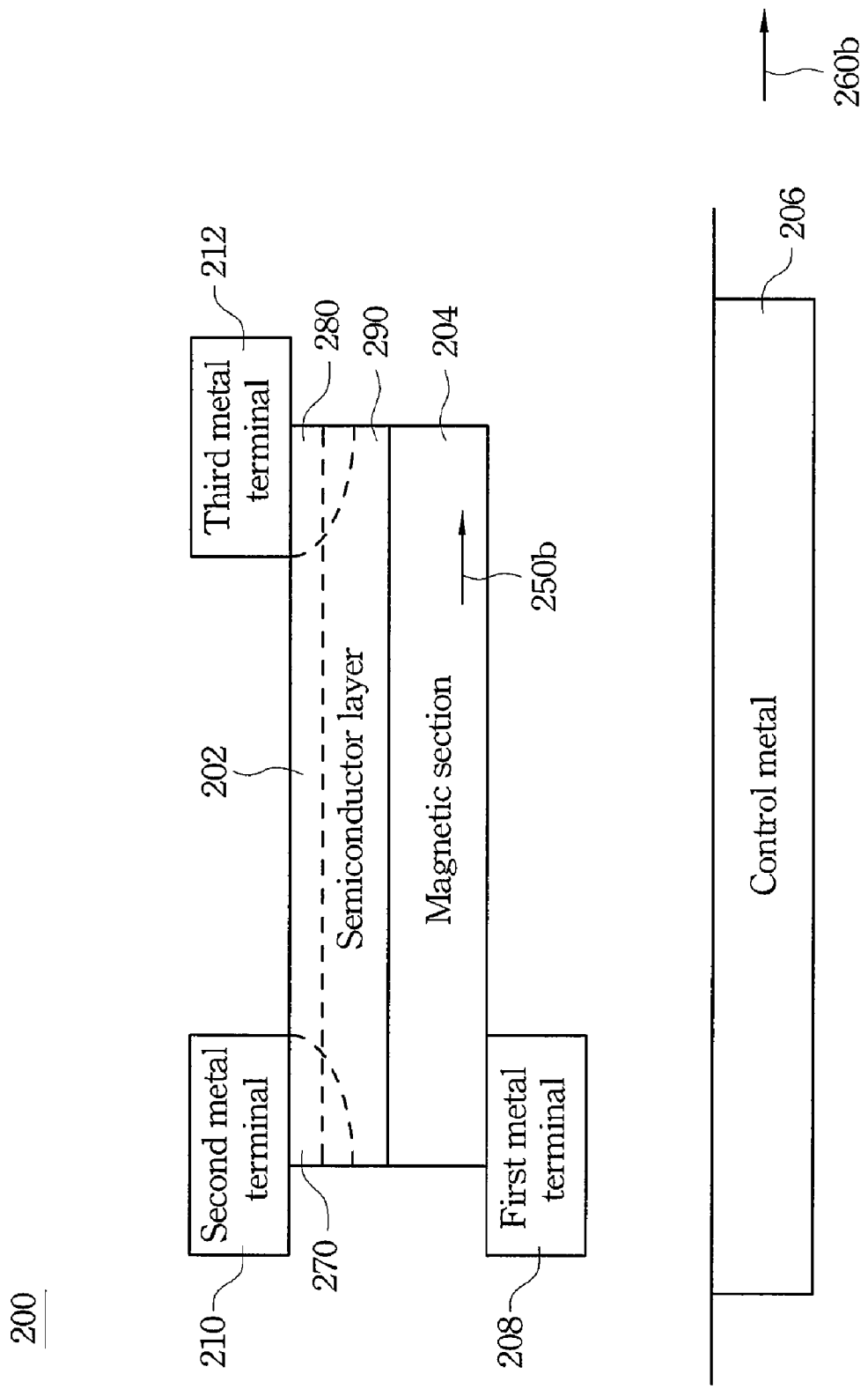

FIG. 2C illustrates there is a current path in the magnetic transistor 200. A current (for example, direction 260b and is equal to or larger than the threshold voltage) in the control metal 206 provides a dipole having a direction 250b in the magnetic section 204, the first conductive region 270 and the second conductive region 280 are met with the conductive channel 290 to form the current path between the second metal terminal 210 and the third metal terminal 212.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic transistor, comprising:
    a magnetic section;
    a thin semiconductor layer, disposed on the magnetic section;
    a first metal terminal, disposed on one end of an opposite surface to the thin semiconductor layer of the magnetic section and being in direct contact with the magnetic section to provide a conductive channel in the thin semiconductor layer;
    a second metal terminal, disposed on one end of an opposite surface to the magnetic section of the thin semiconductor layer and being in direct contact with the thin semiconductor layer to create a first conductive region in the thin semiconductor layer;
    a third metal terminal, disposed on the other end of the opposite surface to the magnetic section of the thin semiconductor layer and being in direct contact with the thin semiconductor layer to create a second conductive region in the thin semiconductor layer; and
    a control metal having no direct connection with the magnetic section, the thin semiconductor layer, and the first, second and third metal terminals, capable of providing an external applied field to control dipole direction in the magnetic section when having a current flowing therein;
    while the magnetic transistor is turned on, a current path is formed between the second metal terminal and the third metal terminal via the thin semiconductor layer.

2. The magnetic transistor of claim 1, wherein the operation of the magnetic transistor is determined by the dipole direction in the magnetic section.

3. The magnetic transistor of claim 1, wherein a thickness of the conductive channel is increased while the magnetic transistor is turned on.

4. The magnetic transistor of claim 1, wherein the operation of the magnetic transistor is determined by a thickness of the thin semiconductor layer.

5. The magnetic transistor of claim 1, wherein the first conductive region and the second conductive region are met with the conductive channel in the thin semiconductor layer to form the current path when the magnetic transistor is turned on.

6. The magnetic transistor of claim 1, wherein the thin semiconductor layer and the magnetic section are about the same length.

7. The magnetic transistor of claim 1, wherein a space exists between the second metal terminal and the third metal terminal disposed on the thin semiconductor layer.

* * * * *